(12) United States Patent
Benson

(10) Patent No.: US 7,244,665 B2
(45) Date of Patent: Jul. 17, 2007

(54) WAFER EDGE RING STRUCTURES AND METHODS OF FORMATION

(75) Inventor: Peter A. Benson, Boise, ID (US)

(73) Assignee: Micron Technology, Inc., Boise, ID (US)

(*) Notice: Subject to any disclaimer, the term of this patent is extended or adjusted under 35 U.S.C. 154(b) by 129 days.

(21) Appl. No.: 10/834,809

(22) Filed: Apr. 29, 2004

(65) Prior Publication Data

US 2005/0245005 A1    Nov. 3, 2005

(51) Int. Cl.
*H01L 21/78* (2006.01)

(52) U.S. Cl. .................. 438/465; 438/780; 118/52; 118/667

(58) Field of Classification Search ............ 438/465, 438/780; 118/52, 667
See application file for complete search history.

(56) References Cited

U.S. PATENT DOCUMENTS

| | | | |
|---|---|---|---|
| 3,976,288 A | 8/1976 | Cuomo, Jr. | |
| 4,266,334 A | 5/1981 | Edwards et al. | |
| 4,925,515 A | 5/1990 | Yoshimura et al. | |
| 5,121,256 A | 6/1992 | Corle et al. | |
| 5,268,065 A | 12/1993 | Grupen-Shemansky | |
| 5,460,703 A | 10/1995 | Nulman et al. | |
| 5,547,906 A | 8/1996 | Badehi | |
| 5,610,683 A | 3/1997 | Takahashi | |
| 5,675,402 A | 10/1997 | Cho et al. | |
| 5,703,493 A | 12/1997 | Weeks et al. | |
| 5,705,016 A | 1/1998 | Senoo et al. | |
| 5,723,385 A | 3/1998 | Shen et al. | |
| 5,803,797 A | 9/1998 | Piper | |
| 5,824,457 A | 10/1998 | Liu et al. | |
| 5,827,394 A | 10/1998 | Lu | |
| 5,833,869 A | 11/1998 | Haas et al. | |
| 5,843,527 A * | 12/1998 | Sanada | 427/240 |
| 5,869,354 A | 2/1999 | Leedy | |
| 5,919,520 A * | 7/1999 | Tateyama et al. | 427/240 |

(Continued)

FOREIGN PATENT DOCUMENTS

EP    0 023 231 A1    4/1981

OTHER PUBLICATIONS

Miller et al., "Maskless Mesoscale Materials Deposition," Deposition Technology, Sep. 2001, pp. 20-22.

(Continued)

*Primary Examiner*—Luan Thai
(74) *Attorney, Agent, or Firm*—TraskBritt, PC

(57) ABSTRACT

An elevated containment structure in the shape of a wafer edge ring surrounding a surface of a semiconductor wafer is disclosed, as well as methods of forming and using such a structure. In one embodiment, a wafer edge ring is formed using a stereolithography (STL) process. In another embodiment, a wafer edge ring is formed with a spin coating apparatus provided with a wafer edge exposure (WEE) system. In further embodiments, a wafer edge ring is used to contain a liquid over a wafer active surface during a processing operation. In one embodiment, the wafer edge ring contains a liquid having a higher refractive index than air while exposing a photoresist on the wafer by immersion lithography. In another embodiment, the wafer edge ring contains a curable liquid material while forming a chip scale package (CSP) sealing layer on the wafer.

35 Claims, 12 Drawing Sheets

U.S. PATENT DOCUMENTS

| | | | |
|---|---|---|---|
| 5,953,590 | A | 9/1999 | Piper et al. |
| 6,033,589 | A * | 3/2000 | Lin .............................. 216/92 |
| 6,039,830 | A | 3/2000 | Park et al. |
| 6,040,248 | A * | 3/2000 | Chen et al. ................. 438/725 |
| 6,042,976 | A | 3/2000 | Chiang et al. |
| 6,048,948 | A | 4/2000 | Tochioka |
| 6,114,253 | A * | 9/2000 | Jang et al. .................. 438/725 |
| 6,140,151 | A | 10/2000 | Akram |
| 6,143,590 | A | 11/2000 | Ohki et al. |
| 6,150,240 | A | 11/2000 | Lee et al. |
| 6,245,646 | B1 | 6/2001 | Roberts |
| 6,251,488 | B1 | 6/2001 | Miller et al. |
| 6,259,962 | B1 | 7/2001 | Gothait |
| 6,268,584 | B1 | 7/2001 | Keicher et al. |
| 6,303,469 | B1 | 10/2001 | Larson et al. |
| 6,322,598 | B1 | 11/2001 | Meuris et al. |
| 6,323,295 | B1 | 11/2001 | Muhlebach et al. |
| 6,326,698 | B1 | 12/2001 | Akram |
| 6,344,402 | B1 | 2/2002 | Sekiya |
| 6,391,251 | B1 | 5/2002 | Keicher et al. |
| 6,399,464 | B1 | 6/2002 | Muntifering et al. |
| 6,413,150 | B1 | 7/2002 | Blair |
| 6,432,752 | B1 | 8/2002 | Farnworth |
| 6,462,273 | B1 | 10/2002 | Corisis et al. |
| 6,462,401 | B2 | 10/2002 | Fujii |
| 6,465,329 | B1 | 10/2002 | Glenn |
| 6,468,832 | B1 | 10/2002 | Mostafazadeh |
| 6,471,806 | B1 | 10/2002 | McKenna et al. |
| 6,472,294 | B2 | 10/2002 | Meuris et al. |
| 6,498,074 | B2 | 12/2002 | Siniaguine et al. |
| 6,506,688 | B2 | 1/2003 | Wu |
| 6,524,881 | B1 | 2/2003 | Tandy et al. |
| 6,537,482 | B1 | 3/2003 | Farnworth |
| 6,551,906 | B2 | 4/2003 | Oka |
| 6,562,661 | B2 | 5/2003 | Grigg |
| 6,582,983 | B1 | 6/2003 | Runyon et al. |
| 6,593,171 | B2 | 7/2003 | Farnworth |
| 6,621,161 | B2 | 9/2003 | Miyawaki |
| 6,680,241 | B2 | 1/2004 | Okamoto et al. |
| 6,683,378 | B2 | 1/2004 | Wing et al. |
| 6,686,225 | B2 | 2/2004 | Wachtler |
| 6,734,032 | B2 | 5/2004 | Tandy et al. |
| 6,736,896 | B2 * | 5/2004 | Lin .............................. 118/52 |
| 6,740,962 | B1 | 5/2004 | Grigg |
| 6,746,899 | B2 | 6/2004 | Grigg |
| 6,749,688 | B2 * | 6/2004 | Tateyama et al. ........... 118/667 |
| 6,908,784 | B1 | 6/2005 | Farnworth et al. |
| 6,940,181 | B2 | 9/2005 | Derderian et al. |
| 2002/0091173 | A1 | 7/2002 | Hashimoto et al. |
| 2002/0171177 | A1 | 11/2002 | Kritchman et al. |
| 2003/0003688 | A1 | 1/2003 | Tandy et al. |
| 2003/0059708 | A1 | 3/2003 | Yamaura et al. |
| 2003/0151167 | A1 | 8/2003 | Kritchman et al. |
| 2004/0229002 | A1 | 11/2004 | Davis et al. |
| 2005/0064681 | A1 | 3/2005 | Wood et al. |
| 2005/0064683 | A1 | 3/2005 | Farnworth et al. |
| 2006/0109630 | A1 | 5/2006 | Colgan et al. |

OTHER PUBLICATIONS

Miller, "New Laser-Directed Deposition Technology," Microelectronic Fabrication, Aug. 2001, p. 16.

Webpage, Object Prototyping the Future, Object FullCure700 Series, 2 pages.

Webpage, Object Prototyping the Future, How it Works, 2 pages.

* cited by examiner

WAFER EDGE RING STRUCTURES AND METHODS OF FORMATION

BACKGROUND OF THE INVENTION

1. Field of the Invention

The present invention relates to the formation and processing of semiconductor wafers. More particularly, the present invention relates to an elevated containment structure in the shape of a ring located around the peripheral edge of a wafer and methods of forming and using such a structure.

2. State of the Art

Solid state electronic devices are manufactured on a mass scale from wafers of semiconductor material that are singulated to provide multiple individual semiconductor dice. Integrated circuitry is formed on a wafer by depositing successive layers of conductive material separated from each other by layers of dielectric insulating material. After deposition, each layer of material is formed into a specific pattern comprising a level of the integrated circuitry, and another layer of material is added. Patterning of each layer of material is typically accomplished with a mask and etch process, wherein a photoresist is applied over the layer of material to be patterned. Portions of the photoresist are exposed by using an optical system to project light or other forms of radiant energy onto the photoresist in a pattern corresponding to the circuitry, and either the exposed or the unexposed portions of the photoresist (depending on the photoresist type) are removed to uncover the underlying layer of material. An etchant is then applied to form the layer of material into the desired circuit pattern. The remaining photoresist is removed, and the next layer of material is deposited. The process is repeated until the levels of circuitry are complete. In this manner, a large number of electronic devices may be simultaneously, formed at the wafer level, thereby increasing manufacturing output.

Another benefit in terms of manufacturing output that is provided by forming multiple electronic devices from wafers is that device packaging may be carried out at the wafer level to form what are commonly referred to as "chip scale packages" (CSPs). CSP structures typically comprise protective layers of a polymer or other material films adhered directly to at least the active surface of a semiconductor die to seal it from the environment. When multiple electronic devices are contained in a wafer, the active surface of the wafer may be coated to provide multiple electronic devices with the aforementioned sealing layer in a single operation, with subsequent singulation of the wafer into individual CSPs. One process for forming CSP sealing layers on a wafer is stereolithography (STL). STL, as conventionally practiced, involves the formation of solid structures by selectively curing volumes of a liquid polymer or other curable liquid material. Depending on the liquid material composition, curing may be accomplished by exposure to irradiation of selected wavelengths of light or other forms of radiant energy, for instance, when curing a material susceptible to initiation of cross-linking by exposure to ultraviolet (UV) radiation. In this manner, CSP sealing layers may be simultaneously formed on multiple electronic devices by depositing and selectively curing one or more layers of a liquid polymer or other liquid sealing material over at least the active surface of a wafer.

While manufacturing electronic devices in wafer form improves efficiency, it raises other processing issues. Projecting a large circuit pattern for multiple electronic devices on a wafer using the above described mask and etch process, for instance, increases the difficulty in maintaining focus of the radiant energy used to expose the photoresist. This problem is exacerbated by the fact that as circuit densities increase, more precise resolution is required for the circuit pattern being projected onto the photoresist. The resolution of an optical system is determined by the equation $R=k_1 (\lambda/NA)$, where $k_1$ is a constant related to process parameters and $\lambda$ is the wavelength of the projected radiant energy. NA is the numerical aperture of the optical system projection lens, which is dependent in part on the refractive index of the medium surrounding the lens through which the radiant energy is projected. Accordingly, the minimum resolvable feature of a circuit pattern projected by an optical system is limited by these resolution factors.

One approach to improve focusing has been to alter the refractive index of the medium surrounding the optical system lens by using immersion lithography. In immersion lithography, the space between the optical system lens and the photoresist on a wafer is filled with a liquid such as water, with the radiant energy for exposing the photoresist being projected therethrough. Because the liquid has a higher refractive index than air, the effective numerical aperture value of the optical system lens is increased and improves resolution. Exemplary immersion lithography optical systems for patterning photoresists on semiconductor wafers are described in U.S. Pat. No. 5,610,683 to Takahashi and European Patent EP 0 023 231 A1 to Tabarelli et al., the disclosures of each of which are incorporated herein by reference. Although these optical systems provide improved resolution for forming circuit patterns on wafers, they involve the use of special tanks or cassettes that surround a wafer in order to contain the liquid for immersion lithography. Major modifications must be made to optical systems in order to accommodate such containment structures, and positioning the additional tanks or cassettes within the optical system may reduce throughput and create a process bottleneck.

Other processing issues related to manufacturing electronic devices in wafer form may also be encountered when forming the above-described CSP sealing layers. In order to coat a wafer with a sealing layer, for example, a liquid polymer or other liquid sealing material must be deposited onto the active surface of the wafer and subsequently cured to form the sealing layer. One known coating method is to submerge a wafer to consecutive depths below the surface of a liquid sealing material contained within a tank, and selectively cure layers of the liquid sealing material overlying the wafer active surface at each depth using the above-described STL process. Examples of such an STL coating method are described in U.S. Pat. No. 6,432,752 to Farnworth and U.S. Pat. No. 6,326,698 to Akram, the disclosures of each of which are incorporated herein by reference. Positioning of the wafer at consecutive depths below the surface of the liquid sealing material may be time consuming, however, and it is often difficult to control the thickness of the liquid sealing material overlying the wafer active surface.

An alternative coating method is to deposit the liquid sealing material onto the wafer active surface using spin coating. In spin coating, a liquid sealing material is deposited on a wafer and spread across the wafer active surface by spinning the wafer on a rotating chuck. While spin coating allows for efficient deposition of the liquid sealing material, it may be difficult to achieve uniform application across the wafer active surface, especially when forming thicker CSP sealing layers. Furthermore, since a wafer must typically be moved to another location to cure the liquid sealing material applied by spin coating, there is the possibility that the uncured liquid sealing material will roll off the wafer active surface during handling.

In view of the foregoing discussion of the prior art, a simple and efficient way is needed to contain liquid over the active surface of a wafer during processing operations such as immersion lithography and forming CSP sealing layers.

BRIEF SUMMARY OF THE INVENTION

The present invention overcomes the problems of the prior art by providing various embodiments of an elevated containment structure in the shape of a ring around the peripheral edge of a wafer. The present invention further provides methods of forming such a wafer edge ring, as well as methods of using a wafer edge ring to contain a liquid over the active surface of a wafer during immersion lithography, formation of CSP sealing layers or other semiconductor wafer processing operations.

In one embodiment according to the present invention, a wafer edge ring is formed using an STL process. A first layer of a curable liquid polymer or other curable liquid material is deposited over the wafer active surface. The peripheral edge of the wafer is exposed to a source of radiant energy to at least partially cure a portion of the curable liquid material to form a first layer of the wafer edge ring. Additional layers of curable liquid material are then deposited over the wafer active surface, with a portion of the curable liquid material of each additional layer being at least partially cured to form another layer of the wafer edge ring superimposed over the first level of the wafer edge ring. Consecutive, superimposed layers of cured material are formed in this manner until the wafer edge ring has reached a desired height above the wafer active surface.

In another embodiment according to the present invention, a wafer edge ring is formed with a spin coating apparatus provided with a wafer edge exposure (WEE) system. A wafer is mounted on a chuck and a curable liquid material is deposited on the wafer. A layer of the curable liquid material is spread across the wafer active surface with centrifugal force by spinning the wafer on the chuck. The peripheral edge of the wafer is then exposed to a source of radiant energy provided by the WEE system associated with the spin coating apparatus to at least partially cure a portion of the layer of curable liquid material to form the wafer edge ring.

In further embodiments according to the present invention, a wafer edge ring is used to contain a liquid over the wafer active surface during a processing operation. According to one exemplary embodiment, the wafer edge ring is used to contain a liquid having a higher refractive index than air over the wafer active surface while exposing a photoresist on the wafer by immersion lithography. According to another exemplary embodiment, the wafer edge ring is used to contain a curable liquid material over the wafer active surface while forming a CSP sealing layer on the wafer.

Further features and advantages of the present invention will be apparent from the following descriptions of the various embodiments when read in conjunction with the accompanying drawings. It will be understood by one of ordinary skill in the art that the following embodiments are provided for illustrative purposes only, and that numerous combinations of the elements of the various embodiments of the present invention are possible.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1A:
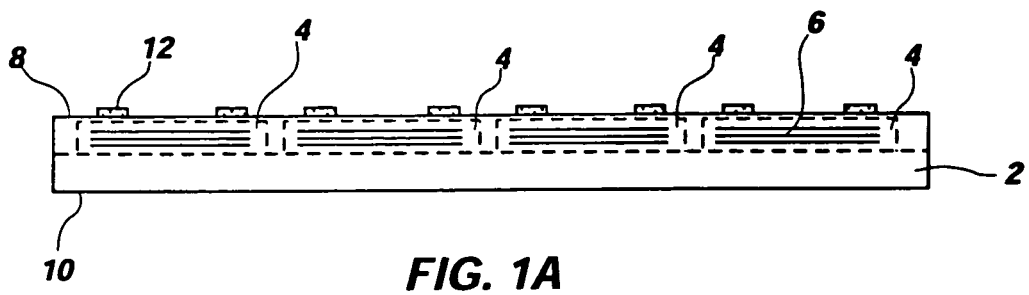
FIGS. 1A and 1B are sectional side views of a semiconductor wafer containing an array of electronic devices.

Referring in general to the accompanying drawings, various aspects of the present invention are illustrated to show the structure and methods of forming a wafer edge ring on a wafer, as well as methods for using a wafer edge ring to contain a liquid over the wafer active surface during processing operations. Common elements and features of the illustrated embodiments are designated by the same or similar reference numerals. It should be understood that the figures presented are not meant to be illustrative of actual views of any particular portion of the disclosed structures, but are merely idealized schematic representations which are employed to more clearly and fully depict the invention.

Illustrated in drawing FIG. 1A is a semiconductor wafer 2 containing an array of electronic devices 4 formed thereon. Typically, the array of electronic devices 4 comprises integrated circuit layers 6 overlying and/or extending into one side of wafer 2, which forms an active surface 8 of the wafer 2. Circuit layers 6 are created by material deposition and photoresist application and patterning in a successive manner using the mask and etch process previously discussed above. The opposite side of wafer 2 remains free of circuitry leaving a passive surface 10 comprised of the semiconductor material of wafer 2. Bond pads 12 are also formed on active surface 8 to provide external electrical contacts for the circuitry of each electronic device 4.

Figure 1B:
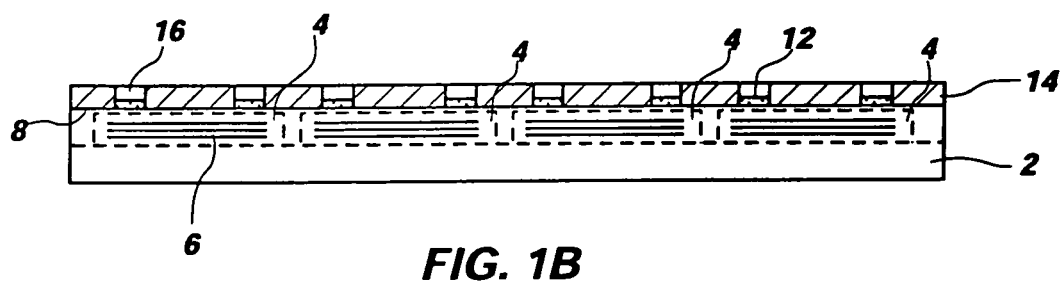

FIG. 1B shows that once circuit layers 6 and bond pads 12 are complete, a chip scale package (CSP) type sealing layer 14 may be included on wafer 2 to cover active surface 8 and provide at least partial wafer level packaging of electronic devices 4. As previously discussed, sealing layer 14 may be formed by depositing a liquid polymer or other liquid sealing material onto active surface 8 using spin coating and subsequently curing the liquid sealing material. FIG. 1B shows that bond pads 12 are exposed through apertures 16 in sealing layer 14 such that they may be electrically connected to higher-level circuitry once wafer 2 has been singulated into individual semiconductor dice. Apertures 16 may be formed by leaving portions of the liquid sealing material overlying bond pads 12 uncured or by etching sealing layer 14 after it has been cured.

The present invention discloses an elevated containment structure in the form of a wafer edge ring 18 (FIG. 2E) that is provided on active surface 8 of wafer 2. As will be described in further detail below, wafer edge ring 18 may be used to contain a liquid over active surface 8 during the processing operations for forming the elements of wafer 2 such as circuit layers 6 and sealing layer 14. According to one embodiment of the present invention, FIGS. 2A–2E show how wafer edge ring 18 may be formed on active surface 8 of wafer 2 using an STL process.

Figure 2A:
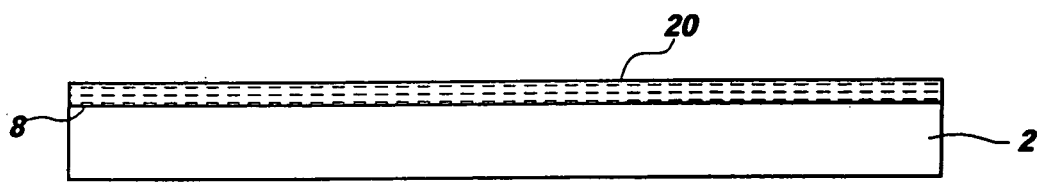
FIGS. 2A–2E are sectional side views showing how a wafer edge ring may be formed on the active surface of a wafer using an STL process.
Figure 2B:
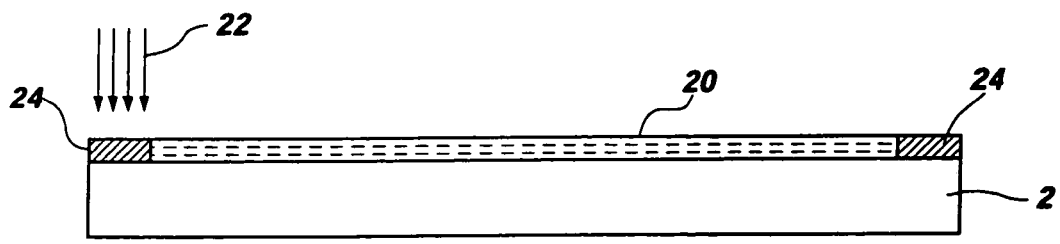
Figure 2C:
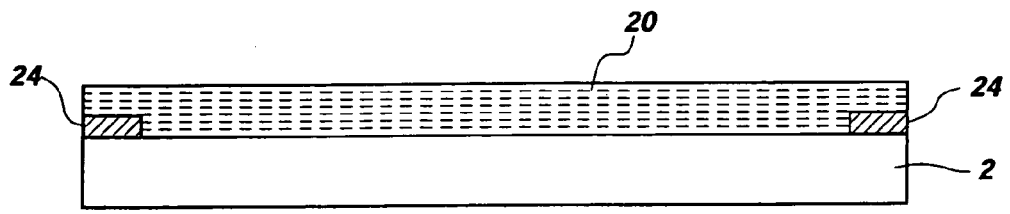
Figure 2D:
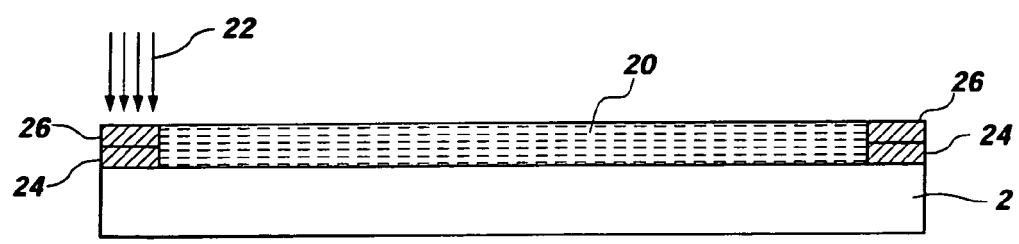

Initially, wafer 2 is processed to a desired level of assembly, such as at an intermediate point of forming circuit layers 6, or up to the point where electronic devices 4 have been completed and provided with bond pads 12. As shown in FIG. 2A, a layer of a photocurable polymer liquid or other photocurable liquid material 20 is then provided over active surface 8 of wafer 2. Next, FIG. 2B shows that a focused beam of radiant energy 22, such as from a laser, is directed onto the surface of liquid material 20 in a pattern that coincides with the peripheral edge of wafer 2. The portions of the liquid material 20 exposed to the focused beam of radiant energy 22 are cured to at least a semisolid state, forming a first layer 24 of wafer edge ring 18. FIG. 2C shows that another layer of liquid material 20 is subsequently provided above first layer 24 of wafer edge ring 18, and in FIG. 2D the focused beam of radiant energy 22 is directed over the same pattern to form a second layer 26 of wafer edge ring 18 superimposed over and bonded to first layer 24. Subsequent layers may be added until the, desired height for wafer edge ring 18 is reached. The number of layers required to form wafer edge ring 18 to a specific height will depend, in part, on the maximum thickness of liquid material 20 that may be penetrated and cured by the focused beam of radiant energy 22. There is currently about a 1 to 10 micron thickness cure capability to completely cure a layer of a photocurable liquid material in situ with lasers conventionally used in STL processes. Reducing the number of layers that must be individually cured, however, may be beneficial in terms of processing time by reducing repetitive operations. Therefore, it may be desirable to use a higher power laser in order to allow curing of thicker layers on the order of, for example, 25 to 200 microns.

Figure 2E:
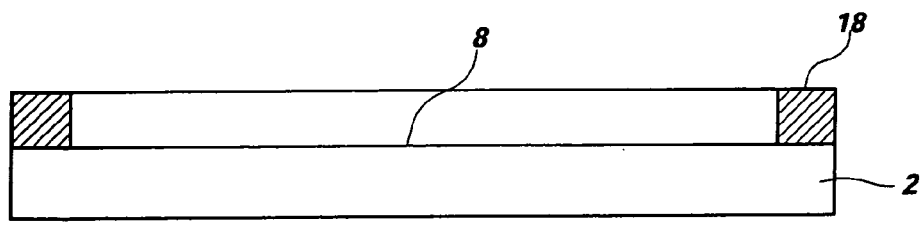
Figure 3:
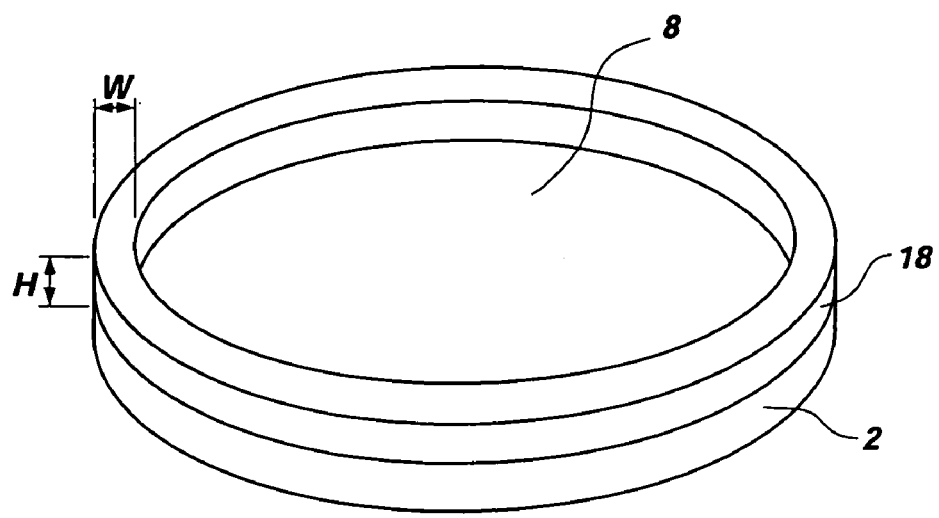
FIG. 3 is a perspective view of the wafer edge ring formed by the STL process of FIGS. 2A–2E.

When the layers have been completed, any uncured liquid material 20 is drained off of wafer 2, leaving wafer edge ring 18 surrounding the exposed area of active surface 8, as shown in FIG. 2E. FIG. 3 is a perspective view of wafer edge ring 18 after it has been formed on active surface 8 of wafer 2. It is noted that the size of wafer edge ring 18 is exaggerated for purposes of, illustration. Actual dimensions for the width W and height H of wafer edge ring 18 will vary based on the structure for which it is used to contain a liquid. Depending on the wafer processing operation with which wafer edge ring 18 is associated, the width W of wafer edge ring 18 may be between about 0.25 mm to 10 mm and the height H may be between about 1 μm and 200 μm. Of course, these dimensions are only exemplary, as wafer edge ring 18 may be of any size necessary to contain a liquid for a given processing operation.

Suitable photocurable liquid polymers which may be used to form wafer edge ring 18 are commercially available from vendors such as 3D Systems Corporation of Valencia, Calif. It is noted, however, that many photocurable liquid polymers currently on the market are formulated with a high sodium (Na) content, which may not be desirable for forming wafer edge ring 18. In certain wafer processing operations, for example, the presence of sodium may raise concerns of ion contamination. Therefore, the composition of the liquid material used to form wafer edge ring 18 should be selected in view of such process considerations. It should also be understood that the use of a photocurable liquid material is only exemplary, and liquid materials cured by other activating agents could be used as well. It is further possible that wafer edge ring 18 could be formed from particulate materials capable of being consolidated into solid structures, rather than using a liquid material.

Liquid material 20 may be deposited on active surface 8 using any method known in the art for carrying out an STL process, including the submersion-type process described in U.S. Pat. No. 6,432,752 to Farnworth and U.S. Pat. No. 6,326,698 to Akram. Using this coating method, wafer 2 would be positioned at consecutive depths below the surface of a volume of liquid material 20 contained within a tank, with selective curing of layers of liquid material 20 overlying the wafer active surface 8 at each depth to form wafer edge ring 18. Suitable equipment for carrying out the submersion-type coating method is commercially available from 3D Systems Corporation of Valencia, Calif. While contemplated as being within the scope of the present invention, as previously discussed above, this coating method may be time consuming and involve difficulties in controlling the thickness of liquid material 20 overlying active surface 8. Another coating method that would provide an efficient way to form wafer edge ring 18 would be to deposit liquid material 20 onto active surface 8 of wafer 2 using spin coating. According to another embodiment of the present invention, FIGS. 4A–4E show how wafer edge ring 18 may be formed with a spin coating apparatus 28 provided with a wafer edge exposure (WEE) system.

Figure 4A:
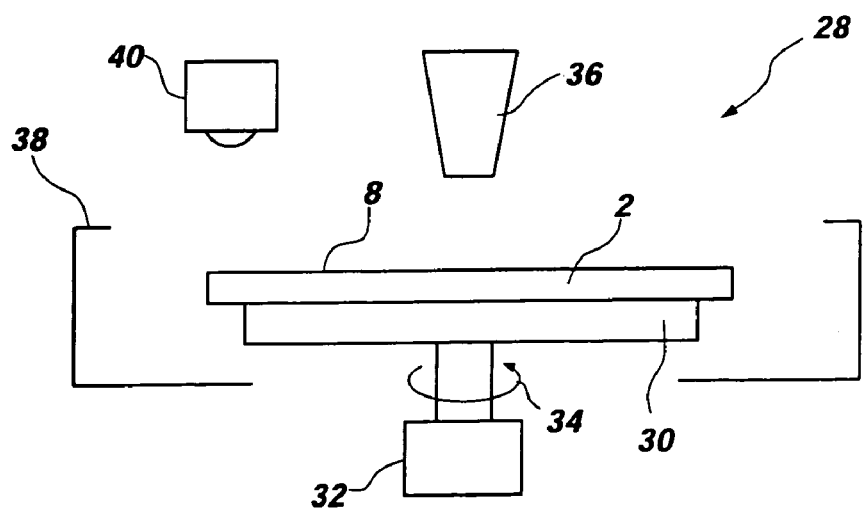
FIGS. 4A–4E illustrate a method for forming a wafer edge ring using a spin coating apparatus provided with a WEE system.

Illustrated in drawing FIG. 4A, spin coating apparatus 28 includes a chuck 30 configured to receive and hold wafer 2, a motor 32 for rotating chuck 30 as shown by arrow 34, and a nozzle 36 positioned above a central portion of chuck 30 for dispensing a liquid material onto active surface 8 of wafer 2. A catch cup 38 is located below and around the periphery of chuck 30 for collecting excess liquid material that may be thrown off of wafer 2 during the spin coating process. As shown in FIG. 4A, the WEE system of spin coating apparatus 28 comprises a focused energy source 40 positioned above chuck 30 for directing a beam of radiant energy 42 (FIG. 4C) onto the peripheral edge of wafer 2. Focused energy source 40 may comprise any of a number of devices capable of directing radiant energy of specific wavelengths onto a targeted area, such as a laser, a light emitting diode, or even a standard lamp that is able to emit a selected-spectrum of radiant energy in a concentrated, focused manner.

Figure 4B:
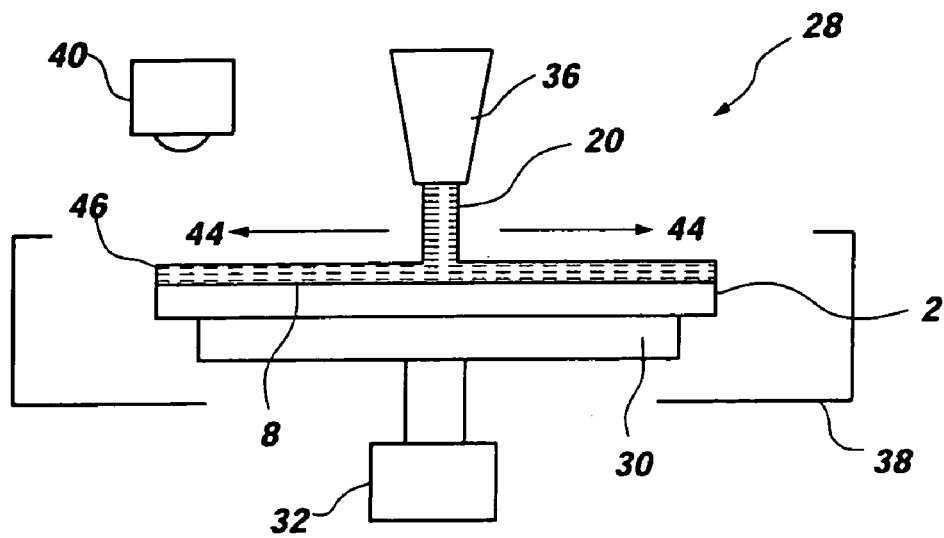
Figure 4C:
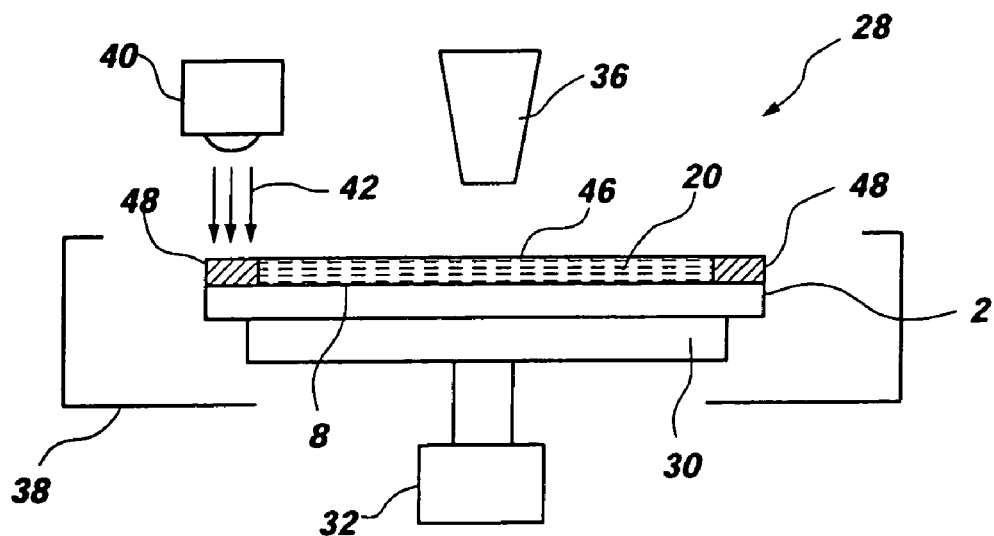
Figure 4D:
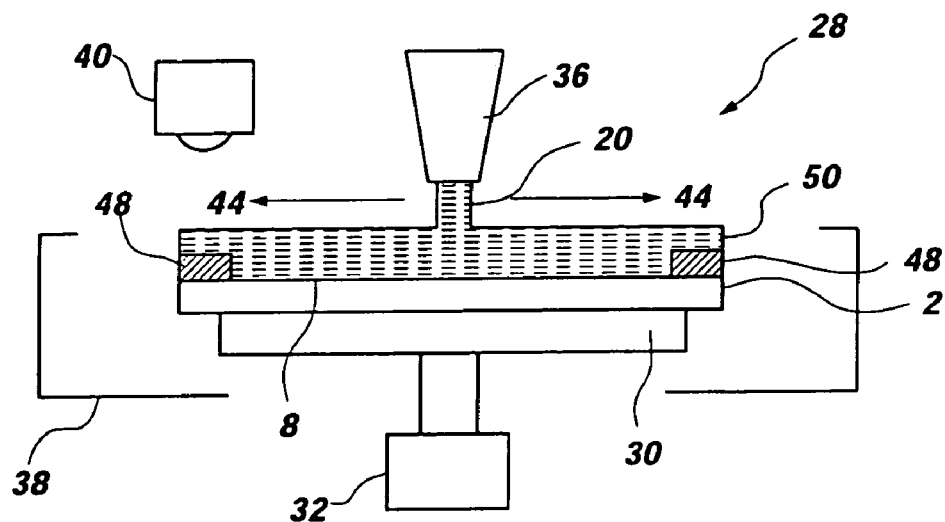
Figure 4E:
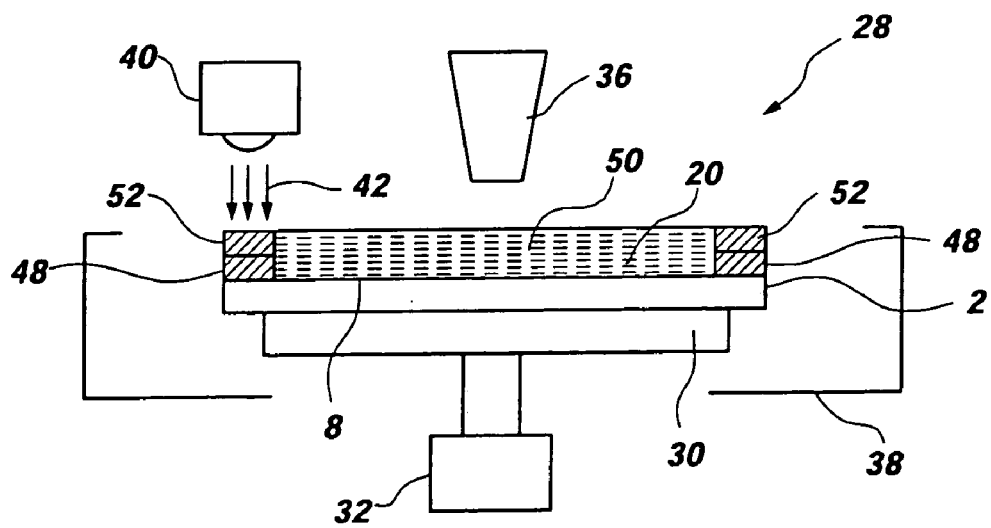

To form wafer edge ring 18 on spin coating apparatus 28, FIG. 4B shows that liquid material 20 is initially dispensed from nozzle 36 while motor 32 rotating chuck 30. Centrifugal force causes liquid material 20 to flow in the direction of arrows 44 toward the peripheral edge of wafer 2, which covers active surface 8 with a smooth, even coating 46 of uncured material. In FIG. 4C, once the entire active surface 8 of wafer 2 has been coated, focused energy source 40 directs the beam of radiant energy 42 onto coating 46. As chuck 30 rotates, liquid material 20 on the peripheral edge of wafer 2 is passed under the beam of radiant energy 42 and cured to at least a semisolid state, forming a first layer 48 of wafer edge ring 18. FIG. 4D shows that additional liquid material 20 is then dispensed from nozzle 36 to provide another coating 50 of uncured material overlying first layer 48 of wafer edge ring 18, and in FIG. 4E the beam of radiant energy 42 is directed onto coating 50 while motor 32 is rotating chuck 30 to form a second layer 52 of wafer edge ring 18 superimposed on first layer 48. Subsequent layers may be added in the same manner until the desired height for wafer edge ring 18 is reached.

Figure 5A:
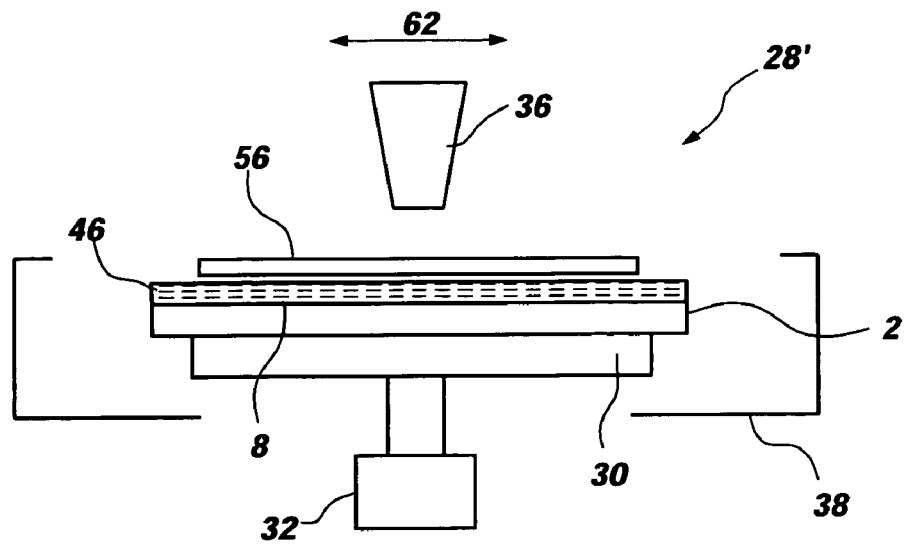
FIGS. 5A and 5B illustrate a method for forming a wafer edge ring using a spin coating apparatus provided with an alternative WEE system.
Figure 5B:
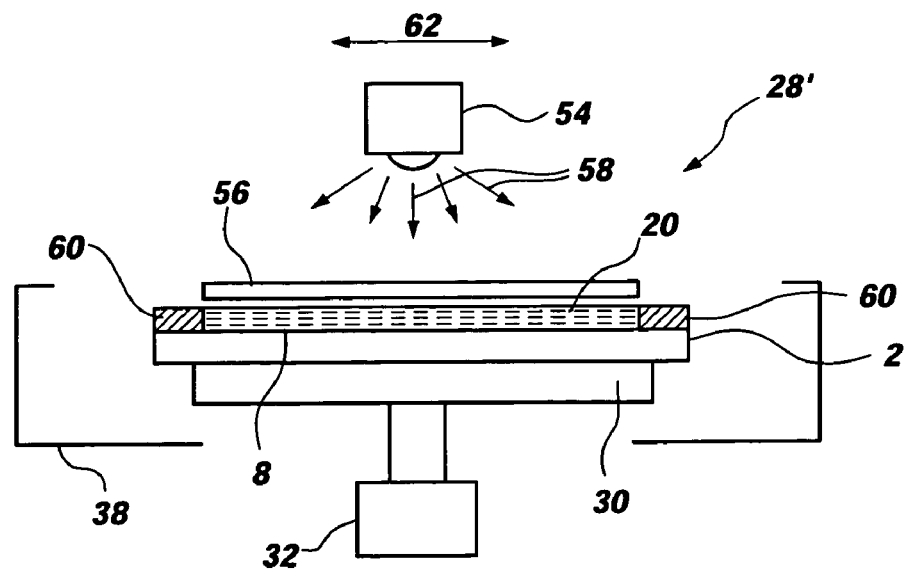

FIGS. 5A and 5B show a spin coating apparatus 28' with an alternative WEE system according to the present invention. The elements of spin coating apparatus 28' are the same as those shown in FIGS. 4A–4E, except that the WEE system does not comprise a focused energy source 40. Instead, the WEE system comprises an energy source 54 (FIG. 5B), such as a lamp, that is capable of flooding the entire perimeter edge of wafer 2 with radiant energy at one time. To form wafer edge ring 18 with spin coating apparatus 28', liquid material 20 is dispensed from nozzle 36 while motor 32 is rotating chuck 30 to form coating 46 in the same manner as described with respect to FIG. 4B. FIG. 5A shows that once active surface 8 of wafer 2 has been coated, a hard mask such as an opaque plate 56 is positioned over wafer 2 to cover the central portion of coating 46 that is to be left uncured. In FIG. 5B, energy source 54 is then activated to flood the area above wafer 2 with radiant energy 58, which cures liquid material 20 in the uncovered portion of coating 46 to at least a semisolid state and forms a first layer 60 of wafer edge ring 18. Opaque plate 56 is subsequently removed from over wafer 2 such that additional liquid material 20 may be dispensed onto active surface 8, and subsequent layers are added in the same manner until the desired height for wafer edge ring 18 has been attained. It is noted that in order for energy source 54 to be able to flood the area above wafer 2 with radiant energy 58, it may be necessary to configure spin coating apparatus 28' with a translation mechanism for moving nozzle 36 away from its dispensing location above wafer 2 and/or for moving energy source 54, as shown by arrows 62 in FIGS. 5A and 5B.

As can be seen by the foregoing description of spin coating apparatus 28 and 28', by positioning energy sources 40 and 54 above chuck 30, wafer edge ring 18 may be formed without having to move wafer 2 to another location, which would be the case with conventional spin coaters utilizing a separately situated WEE system. Examples of manufacturers of spin-coating equipment that is suitable for use with the present invention and that may be adapted to incorporate the illustrated WEE systems of spin coating apparatus 28 and 28' include Dainippon Screen Manufacturing Company Ltd. of Kyoto, Japan, and SVG, Inc. of San Jose, Calif.

Having described the basic structure of wafer edge ring 18 and methods for its formation, it will now be shown how wafer edge ring 18 may be used to contain a liquid over the active surface 8 of wafer 2 in conjunction with a wafer processing operation. In one exemplary embodiment, wafer edge ring 18 is used to contain a liquid in conjunction with an immersion lithography process.

As previously discussed above, integrated circuit layers 6 of electronic devices 4 are typically formed by successive deposition of conductive and dielectric material layers onto the active surface 8 of wafer 2 and forming the deposited material into desired circuit patterns using a mask and etch process. FIGS. 6A–6F illustrate how the mask and etch process is conventionally carried out. Initially, in FIG. 6A, a layer of circuit material 64 is provided on active surface 8 using a known deposition process, such as sputtering or chemical vapor deposition (CVD). By way of example, the layer of circuit material 64 may be a conductive material comprising a metal or a polysilicon, or a dielectric insulating material such as silicon dioxide ($SiO_2$) or silicon nitride ($Si_3N_4$). A photoresist 66 is then formed over the layer of circuit material 64, as shown in FIG. 6B, commonly with a deposition process, such as spin coating. FIG. 6C shows that portions 66a of photoresist 66 are subsequently exposed by using an optical system 68 to project light or other forms of radiant energy 70 onto photoresist 66 in a desired circuit pattern. Optical system 68 operates by passing radiant energy 70 through a reticle 72 printed with the circuit pattern, which is projected through a lens 74 that focuses the circuit pattern onto photoresist 66. It should be noted that the size of lens 74 as depicted in FIG. 6C, as well as in FIGS. 7C and 7D described below, is exaggerated for purposes of illustration. As shown in FIG. 6C, photoresist 66 is a negative acting photoresist, wherein the portions 66a thereof that are exposed to radiant energy 70 become insoluble to a developing solution. Of course, using a negative photoresist is only exemplary, as photoresist 66 may also be a positive photoresist where the exposed portions become more soluble.

Figure 6A:
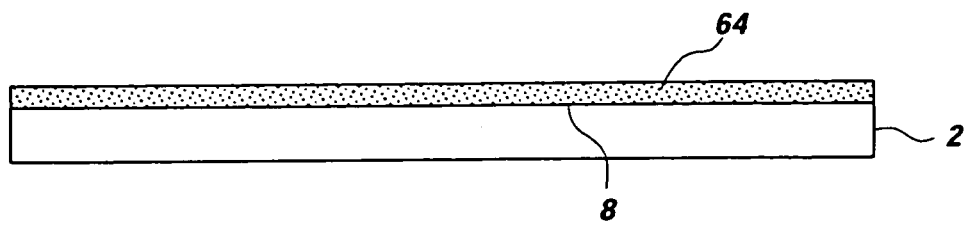
FIGS. 6A–6F illustrate a conventional mask and etch process for forming integrated circuit layers on a system.
Figure 6B:
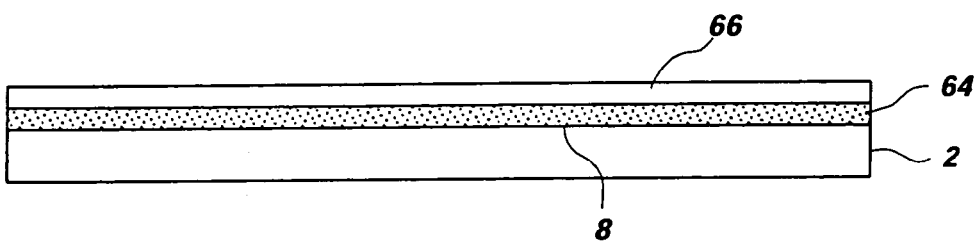
Figure 6C:
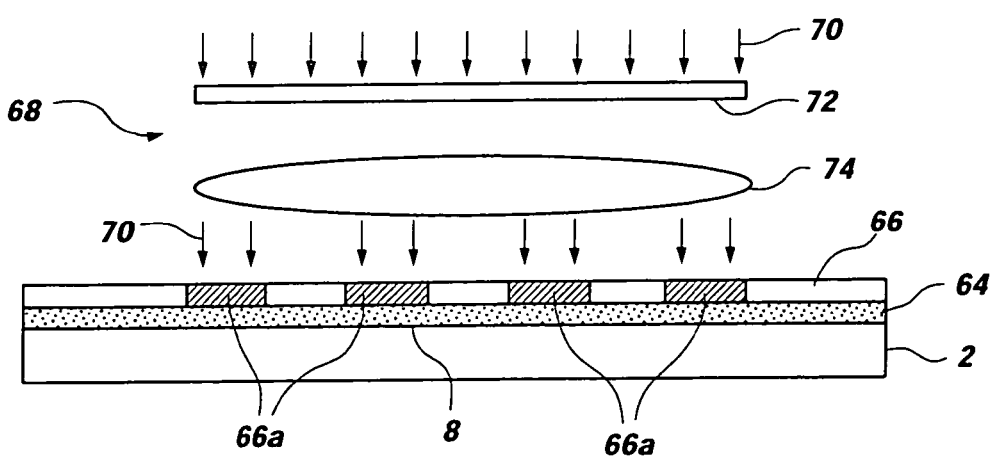
Figure 6D:
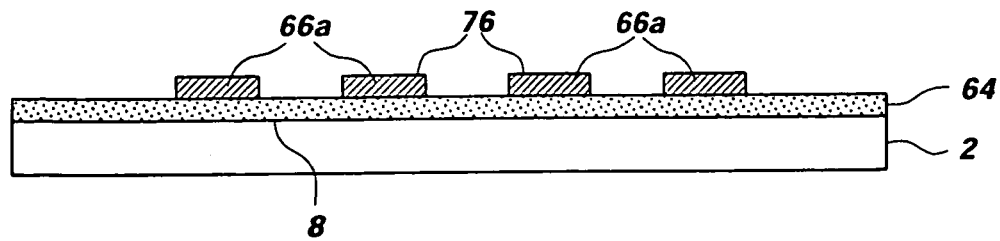
Figure 6E:
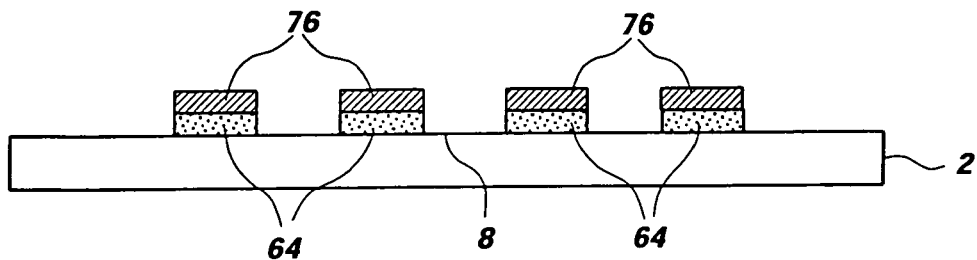
Figure 6F:
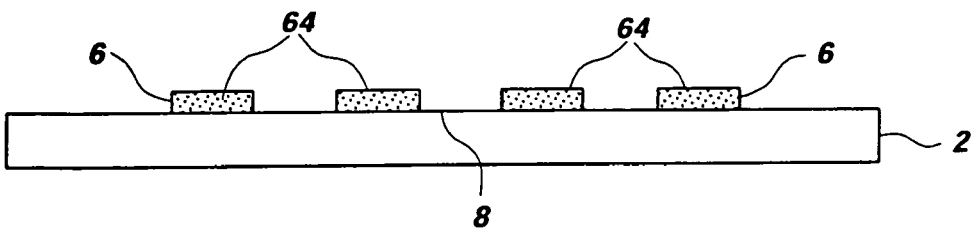

Once the exposure has been completed, a developing solution is applied to remove the unexposed portions of photoresist 66, as shown in FIG. 6D. The portions 66a of photoresist 66 that remain form a mask 76 that covers the layer of circuit material 64. In FIG. 6E, an etchant is used to remove the portions of the layer of circuit material 64 that are not covered by mask 76. FIG. 6F shows that mask 76 is then stripped off, leaving the remaining portions of the layer of circuit material 64 in the shape of the desired circuit pattern that forms a given circuit layer 6. This process is repeated by depositing additional layers of circuit material 64 onto active surface 8, each layer of circuit material 64 being formed into a specific pattern comprising a circuit layer 6 of electronic devices 4. When all the circuit layers 6 of electronic devices 4 have been completed, bond pads 12 may be formed on active surface 8 using the same mask and etch process to provide external electrical contacts for the circuitry of each electronic device 4.

Although forming circuit layers 6 in this manner enables the simultaneous fabrication of a large number of electronic devices 4 on wafer 2, the process may be limited by the ability of optical system 68 to properly focus radiant energy that is being projected onto photoresist 66. When forming high density electronic devices, the elements of a desired circuit pattern may be smaller than the minimum resolvable feature that an optical system is capable of reliably projecting. One solution to this problem is by way of the above-described immersion lithography process, wherein resolution is improved by filling the space between an optical system lens and a photoresist with a liquid having a higher refractive index than air. FIGS. 7A–7G show how wafer edge ring 18 may be used to contain a liquid for carrying out immersion lithography, rather than having to use special tanks or cassettes to contain the liquid over active surface 8 of wafer 2.

Figure 7A:
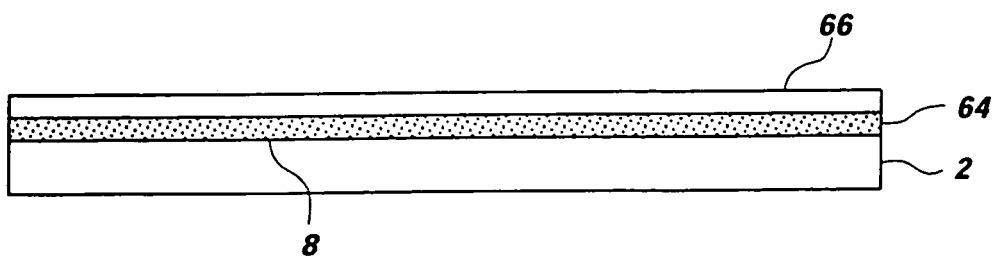
FIGS. 7A–7G illustrate a method of using a wafer edge ring in conjunction with an immersion lithography process.
Figure 7B:
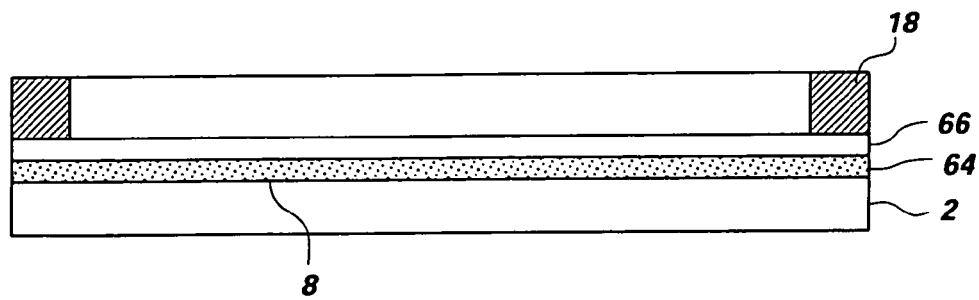
Figure 7C:
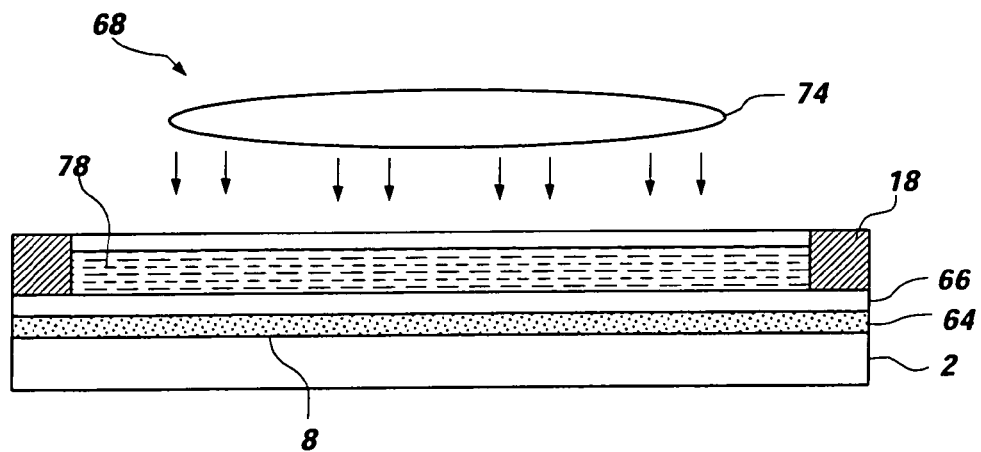
Figure 7D:
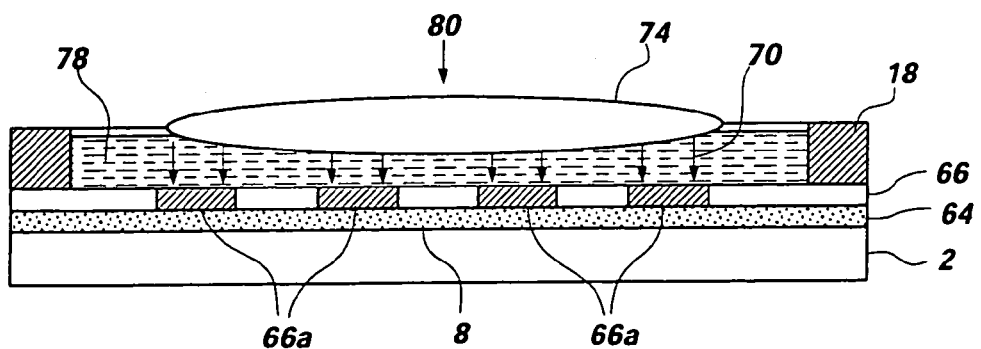

In FIG. 7A, wafer 2 is provided with a layer of circuit material 64 and a photoresist 66 in the same manner as described with respect to FIGS. 6A and 6B. Thereafter, FIG. 7B shows that wafer edge ring 18 is formed over photoresist 66 using, by way of example, a photocurable polymer liquid dispensed and cured with the above-described STL process and wafer coating methods. At this point, wafer 2 is positioned below lens 74 of optical system 68 and the interior of wafer edge ring 18 is partially filled with an immersion liquid 78, as seen in FIG. 7C. The composition of immersion liquid 78 will depend on the desired resolution for circuit patterns to be projected by optical system 68. Deionized water, which has an index of refraction of about 1.47, is suitable for use with circuit linewidths in the range of about 40 nm. For smaller circuit features, a liquid with an even greater refractive index may be required. Arrow 80 in FIG. 7D shows that lens 74 is then brought into contact with immersion liquid 78 in a known fashion, and radiant energy 70 is passed therethrough to expose portions 66*a* of photoresist 66 in the desired circuit pattern. When exposing portions of photoresist 66 that are in close proximity to the edge of wafer 2, it is important that lens 74 not be subjected to any contact with wafer edge ring 18 that might cause damage or reduce resolution capabilities. Therefore, depending on the configuration of optical system 68, it may be necessary to limit the formation of electronic devices 4 on wafer 2 to locations where sufficient clearance will be provided between lens 74 and wafer edge ring 18.

Figure 7E:
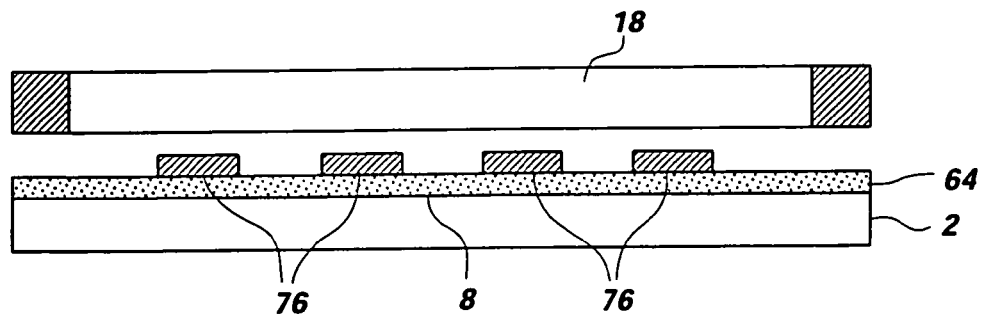
Figure 7F:
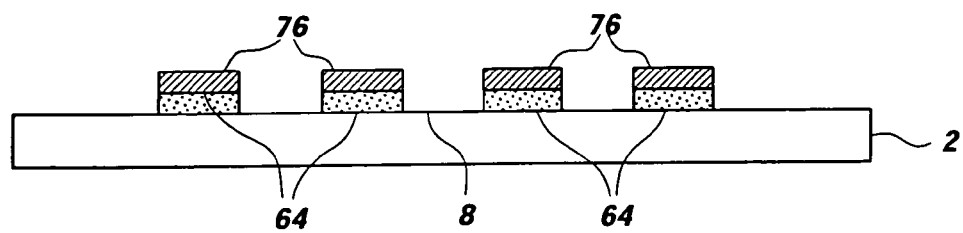
Figure 7G:
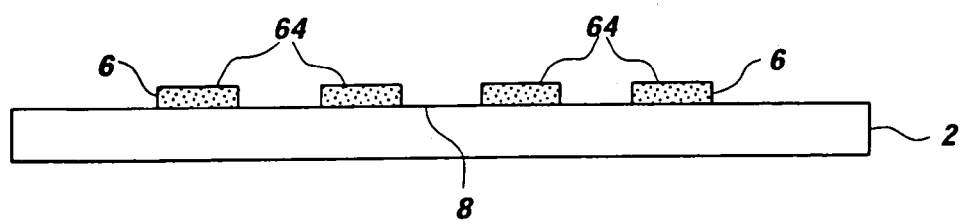

Once the exposure has been completed, immersion liquid 78 is drained from the interior of wafer edge ring 18, and a developing solution of, for example, 2.8% tetramethyl ammonium hydroxide (TMAH), is applied to remove the unexposed portions of photoresist 66. Removal of the unexposed portions of photoresist 66 forms mask 76 over the layer of circuit material 64, and also undercuts and detaches wafer edge ring 18, as shown in FIG. 7E. In FIG. 7F, an etchant is used to remove the portions of the layer of circuit material 64 that are exposed through mask 76. FIG. 7G shows that mask 76 is then stripped off, leaving the remaining portions of the layer of circuit material 64 in the shape of the desired circuit pattern that forms a given circuit layer 6.

Figure 8:
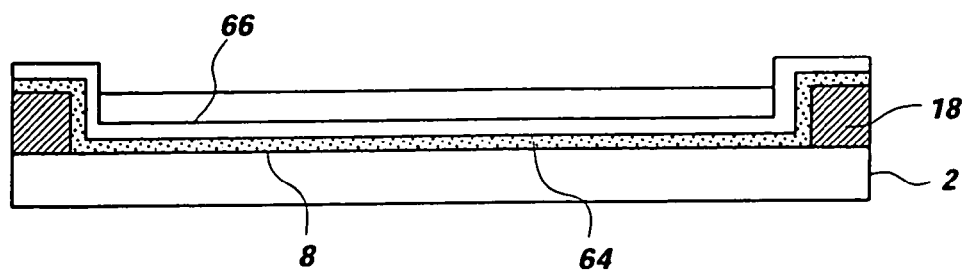
FIG. 8 illustrates an alternative method of using a wafer edge ring in conjunction with an immersion lithography process.

While the immersion lithography process has been described in terms of forming wafer edge ring 18 over the layer of circuit material 64 and photoresist 66, it is also possible that wafer edge ring 18 could be formed on active surface 8 first, with subsequent deposition of the layer of circuit material 64 and photoresist 66, as shown by FIG. 8. This approach may be desirable if there are concerns that the layer of circuit material 64 and photoresist 66 may become contaminated by exposure to the processing environment for forming wafer edge ring 18. Once the layer of circuit material 64 and photoresist 66 are formed over wafer edge ring 18, the immersion lithography process is carried out to form mask 76 in the same manner as described with respect to FIGS. 7C through 7E. The only difference is that wafer edge ring 18 is not detached by removing uncured portions of photoresist 66, as shown in FIG. 7E, since wafer edge ring 18 does not overlie photoresist 66. Depending on the composition of wafer edge ring 18, it is impossible that the developing solution selected for removing unexposed portions of photoresist 66 may also be able to detach wafer edge ring 18 from wafer 2. If this is not possible, wafer edge ring 18 must be removed by another process, such as by applying a different solvent. After wafer edge ring 18 has been removed, circuit layer 6 is completed in the same manner as described with respect to FIGS. 7F and 7G.

Another alternative to the immersion lithography process contemplated as being within the scope of the present invention is to form wafer edge ring 18 out of the same material as photoresist 66. As previously discussed, photoresists are commonly applied to a wafer by spin coating. Accordingly, by forming wafer edge ring 18 of the same material as photoresist 66, both structures may be fabricated at the same processing location, such as by using spin coating apparatus 28 or 28'. Under this approach, wafer edge ring 18 is initially formed on active surface 8 by spinning on successive layers of photoresist material, and exposing each layer using one of the methods illustrated by FIGS. 4A–5B. Each layer of wafer edge ring 18 is exposed with the WEE system of spin coating apparatus 28 or 28', such that the photoresist material is solidified to a "soft-cured" state but is not completely cross-linked. Unexposed photoresist material remaining within the interior of wafer edge ring 18 is then removed, and another layer is spun on to the exposed portion of active surface 8 to form photoresist 66. Thereafter, photoresist 66 may be formed into mask 76 using the same process illustrated by FIGS. 7C–7E, with the soft-cured state of wafer edge ring 18 being removed by application of a solvent. Depending on the composition of the photoresist material the developing solution that is used to remove portions of photoresist 66 may also act as the solvent for removing wafer edge ring 18.

According to another exemplary embodiment of the present invention, wafer edge ring 18 is used to contain a curable liquid material over active surface 8 while forming CSP sealing layer 14 (FIG. 1B) on wafer 2. Typically, coating wafer 2 with sealing layer 14 involves depositing and curing a liquid polymer or other curable liquid sealing material 82 (FIG. 9) onto active surface 8 of wafer 2. One known coating method is to submerge wafer 2 to consecutive depths below the surface of liquid sealing material 82 contained within a tank and selectively cure layers of liquid sealing material 82 onto active surface 8 using an STL process. Positioning wafer 2 at consecutive depths may be time consuming, however, and it is often difficult to control the thickness of liquid sealing material 82 overlying active surface 8. An alternative coating method is to deposit liquid sealing material 82 onto active surface 8 using spin coating. While using spin coating to form sealing layer 14 may be more efficient in terms of time and complexity than the submersion-type STL process, it may introduce other undesirable processing problems.

Figure 9:
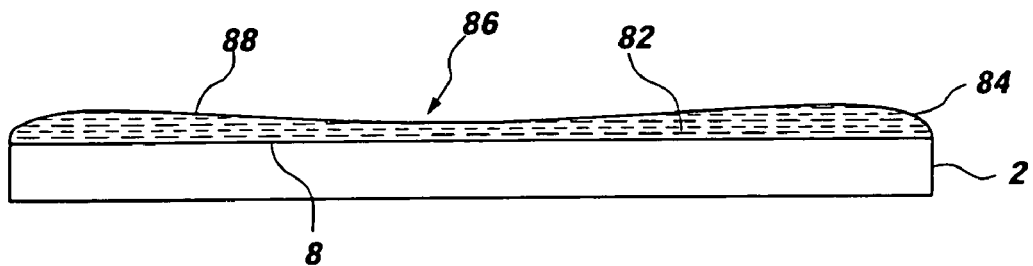
FIG. 9 shows the deposition of CSP sealing material according to a prior art spin coating process.

In order to properly protect an electronic device 4, for example, a conventional semiconductor grade polymer used to form sealing layer 14 may require a thickness of up to about 40 μm or more. It may be difficult to coat active surface 8 with a single, uniform layer of liquid sealing material 82 having such a thickness by using spin coating. As shown in FIG. 9, for example, surface tension effects may cause the circumferential edge 84 of a thick coating 86 of liquid sealing material 82 deposited on active surface 8 by spin coating to have a rounded or curved configuration. FIG. 9 also shows that the additional mass of coating 86 may cause more liquid sealing material 82 to spread toward circumferential edge 84 such that coating 86 has an uneven upper surface 88. Furthermore, when liquid sealing material 82 is a low-viscosity liquid, it may be thrown off of active surface 8 before the desired thickness of coating 86 is achieved. Since wafer 2 must typically be moved to another location to cure liquid sealing material 82 after spin coating, there is the added possibility that the uncured liquid sealing material 82 will roll off active surface 8 during handling.

Figure 10A:
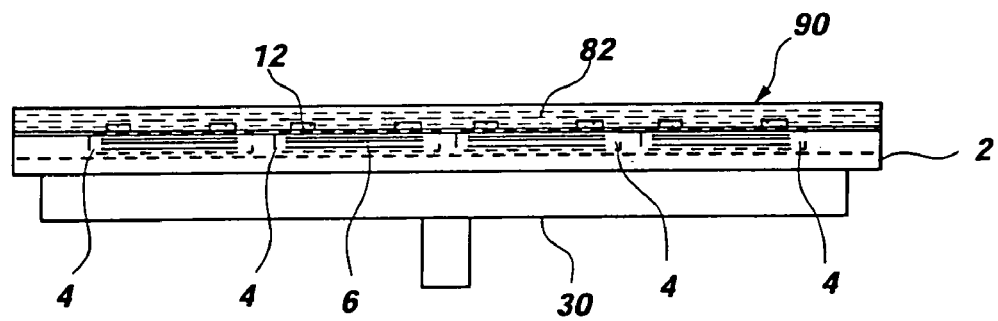
FIGS. 10A–10D illustrate a method of using a wafer edge ring to form a CSP sealing layer in conjunction with a spin coating process.
Figure 10B:
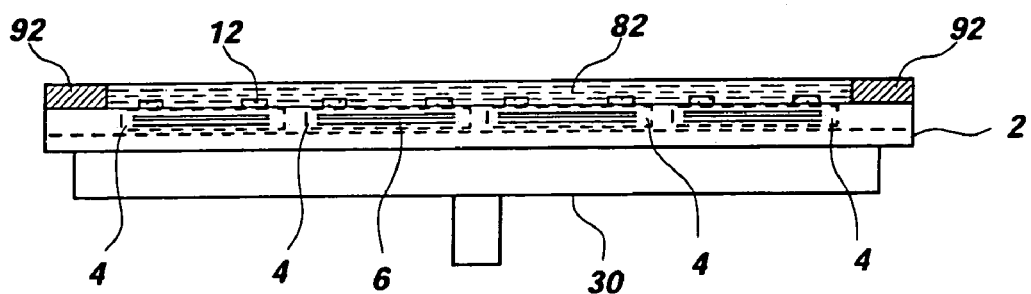
Figure 10C:
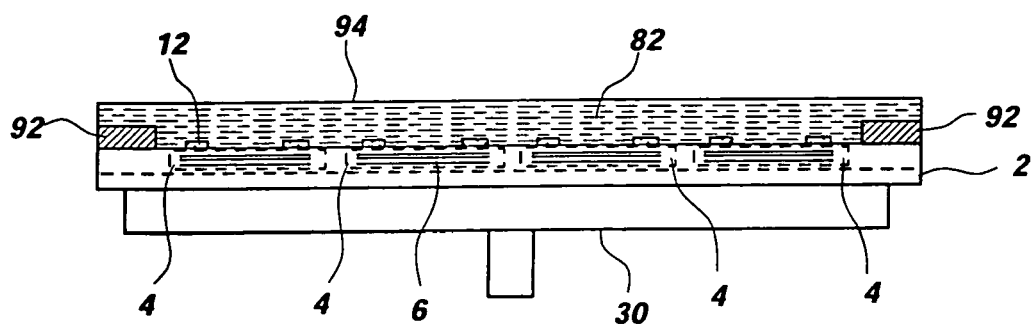
Figure 10D:
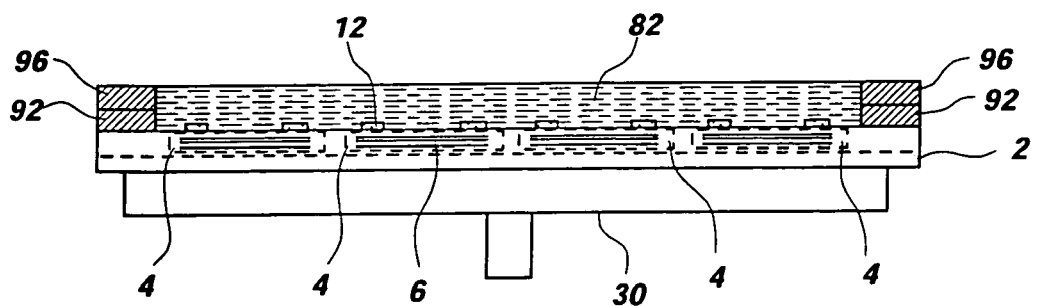

According to the present invention, wafer edge ring 18 may be used to contain liquid sealing material 82 during spin coating in order to overcome these problems. Initially, wafer 2 is processed up to the point where electronic devices 4 have been completed and provided with bond pads 12, as shown in FIG. 1B. FIG. 10A shows that wafer 2 is placed on the chuck 30 of a spin coating apparatus having a WEE system, such as the previously described spin coating apparatus 28 or 28', and a first coating 90 of liquid sealing material 82 is applied to active surface 8. The peripheral edge of wafer 2 is then exposed to radiant energy using one of the WEE system configurations previously described with respect to FIGS. 4C–5B. This cures liquid sealing material 82 to at least a semisolid state and forms a first layer 92 of wafer edge ring 18, as shown by FIG. 10B. In FIG. 10C, additional liquid sealing material 82 is dispensed onto active surface 8 to provide another coating 94 of uncured material overlying first layer 92 of wafer edge ring 18. The peripheral edge of wafer 2 is once again exposed to radiant energy from the WEE system to at least partially solidify liquid sealing material 82, forming a second layer 96 of wafer edge ring 18 superimposed on first layer 92, as shown in FIG. 10D. Subsequent layers may be added in the same manner until wafer edge ring 18 reaches a height corresponding to the desired thickness for sealing layer 14.

Once wafer edge ring 18 is complete, the remaining liquid sealing material 82 contained therein may be cured to form sealing layer 14, as shown in FIG. 1B. The remaining liquid sealing material 82 may be cured by exposure to radiant energy, or by another process such as applying heat or allowing liquid sealing material 82 to cure over time under ambient environmental conditions. The specific curing process will depend on the specific composition of liquid sealing material 82, as will be apparent to one of ordinary skill in the art. Apertures 16 may be formed in sealing layer 14 by leaving portions of liquid sealing material 82 overlying bond pads 12 uncured or by etching sealing layer 14 after it has been cured.

By forming sealing layer 14 with wafer edge ring 18, the present invention overcomes the prior art problems of uneven distribution when forming thicker material coatings. Because each coating of liquid sealing material 82 is formed into a layer of wafer edge ring 18, the resultant structure of sealing layer 14 will have a substantially straight circumferential edge without a rounded or curved configuration as shown with coating 86 in FIG. 9. Furthermore, the presence of wafer edge ring 18 allows liquid sealing material 82 to be applied in a number of thin layers, having a thickness of, for example, about 5 μm to 10 μm. Depositing a number of thin layers by spin coating, rather than a single, large layer, allows liquid sealing material 82 to be spread across active surface 8 in a more uniform manner. Finally, wafer edge ring 18 helps prevent liquid sealing material 82 from rolling off of active surface 8 if it is necessary to move wafer 2 to another location to complete the curing of sealing layer 14.

The above-illustrated embodiments and variations thereof of the present invention provide methods for forming a wafer edge ring, as well as methods of using a wafer edge ring to contain a liquid over the active surface of a wafer during immersion lithography or formation of CSP sealing layers. Although the present invention has been depicted and described with respect to the illustrated embodiments, various additions, deletions and modifications are contemplated within its scope. It is contemplated, for example, that such a wafer edge ring may be used in conjunction with wafer processing operations other than immersion lithography or CSP formation. While the above-illustrated embodiments show a wafer edge ring as being formed around the entire active surface of a wafer, it is also possible that the wafer edge ring may be formed around only a portion of the active surface. For certain wafer processes, it may even be desirable to form the wafer edge ring on the passive surface of the wafer, such as when forming a CSP sealing layer over the passive surface. The scope of the invention is, therefore, indicated by the appended claims rather than the foregoing description. All changes which come within the meaning and range of equivalency of the claims are to be embraced within their scope.

What is claimed is:

1. A method of forming an elevated containment structure surrounding a surface of a semiconductor wafer comprising:
   depositing a layer of liquid material on the surface of the semiconductor wafer;
   selectively curing a portion of the layer of the liquid material along a peripheral edge of the surface of the semiconductor wafer to at least a semisolid state to form a first layer of the elevated containment structure bonded to the surface of the semiconductor wafer;
   depositing at least another layer of the liquid material on the surface of the semiconductor wafer; and
   selectively curing a portion of the at least another layer of the liquid material along the peripheral edge of the surface of the semiconductor wafer to at least a semisolid state to form at least another layer of the elevated containment structure bonded to and superimposed over the first layer of the elevated containment structure.

2. The method of claim 1, wherein selectively curing the portion of the layer of the liquid material and the portion of the at least another layer of the liquid material to at least a semisolid state comprises exposing the liquid material to radiant energy.

3. The method of claim 2, wherein the liquid material is selected to comprise a photocurable polymer liquid.

4. The method of claim 3, wherein the photocurable polymer liquid is selected to comprise a photocurable polymer liquid with substantially no sodium content.

5. The method of claim 1, farther comprising forming the elevated containment structure in a substantially ring-shaped pattern surrounding the surface of the semiconductor wafer.

6. The method of claim 5, further comprising forming the elevated containment structure with a width of between about 0.25 mm and about 10 mm.

7. The method of claim 5, further comprising forming the elevated containment structure with a height of between about 1 μm and about 200 μm.

8. The method of claim 1, wherein depositing the layer of the liquid material and the at least another layer of the liquid material on the surface of the semiconductor wafer comprises positioning the semiconductor wafer at consecutive depths below a surface of a volume of the liquid material contained within a tank.

9. The method of claim 8, wherein selectively curing the portion of the layer of the liquid material and the portion of the at least another layer of the liquid material to at least a semisolid state comprises exposing a portion of the liquid material to radiant energy at each consecutive depth of the semiconductor wafer below the surface of the volume of the liquid material.

10. The method of claim 1, wherein depositing the layer of the liquid material and the at least another layer of the liquid material on the surface of the semiconductor wafer comprises depositing the liquid material on the semiconductor wafer with a spin coating apparatus.

11. The method of claim 10, wherein selectively curing the portion of the layer of the liquid material and the portion of the at least another layer of the liquid material to at least a semisolid state comprises exposing the liquid material to radiant energy provided by a WEE system associated with the spin coating apparatus.

12. The method of claim 11, wherein exposing the liquid material to radiant energy comprises passing the peripheral edge of the surface of the semiconductor wafer under a focused beam of radiant energy provided by the WEE system.

13. The method of claim 11, wherein exposing the liquid material to radiant energy comprises positioning an opaque plate over a central portion of the surface of the semiconductor wafer and simultaneously flooding the entire peripheral edge of the surface of the semiconductor wafer with the radiant energy provided by the WEE system.

14. The method of claim 13, further comprising moving at least one of a dispensing nozzle of the spin coating apparatus and a source of the radiant energy provided by the WEE system prior to exposing the liquid material to the radiant energy.

15. The method of claim 1, further comprising forming a photoresist over the surface of the semiconductor wafer and forming the elevated containment structure on the photoresist.

16. The method of claim 1, further comprising forming a photoresist over the surface of the semiconductor wafer and forming the elevated containment structure.

17. The method of claim 1, further comprising:
forming a photoresist over the surface of the semiconductor wafer; and
forming the elevated containment structure from a liquid material used to form the photoresist.

18. The method of claim 17, wherein the liquid material used to form the photoresist is selected to comprise a negative acting photoresist material.

19. The method of claim 1, further comprising forming the elevated containment structure on a surface of the semiconductor wafer having a plurality of bond pads.

20. The method of claim 19, further comprising:
containing a volume of the liquid material within the elevated containment structure; and
curing the volume of the liquid material to an at least semisolid state to form a CSP sealing layer over the surface of the semiconductor wafer.

21. The method of claim 20, further comprising forming a plurality of apertures in the CSP sealing layer to expose the plurality of bond pads on the surface of the semiconductor wafer.

22. The method of claim 21, wherein forming the plurality of apertures in the CSP sealing layer comprises leaving portions of the liquid material overlying the plurality of bond pads uncured when forming the CSP sealing layer.

23. The method of claim 21, wherein forming the plurality of apertures in the CSP sealing layer comprises etching the CSP sealing layer after curing the volume of the liquid material.

24. A method of processing a wafer by immersion lithography, comprising:
providing a semiconductor wafer having an elevated containment structure bonded thereto, wherein the elevated containment structure surrounds a surface of the semiconductor wafer;
positioning the surface of the semiconductor wafer beneath a lens of an optical system;
at least partially filling an interior of the elevated containment structure with an immersion liquid to cover the surface of the semiconductor wafer with the immersion liquid;
contacting the immersion liquid with the lens of the optical system; and
directing radiant energy onto the surface of the semiconductor wafer by passing the radiant energy through the lens and the immersion liquid.

25. The method of claim 24, wherein the surface of the semiconductor wafer is covered with a layer of circuit material and a photoresist overlying the layer of circuit material, and further comprising:
curing a portion of the photoresist with the radiant energy passed through the lens and the immersion liquid;
draining the immersion liquid from the interior, of the elevated containment structure after curing the portion of the photoresist;
applying a developing solution to remove an uncured portion of the photoresist, wherein the cured portion of the photoresist forms a mask overlying the layer of circuit material;
etching a portion of the layer of circuit material exposed through the mask; and
removing the mask from the layer of circuit material.

26. The method of claim 25, further comprising forming the elevated containment structure over the photoresist.

27. The method of claim 26, wherein applying the developing solution to remove the uncured portion of the photoresist detaches the elevated containment structure from the semiconductor wafer.

28. The method of claim 25, further comprising covering the surface of the semiconductor wafer with the layer of circuit material and the photoresist after forming the elevated containment structure on the semiconductor wafer.

29. The method of claim 28, further comprising detaching the elevated containment structure from the semiconductor wafer with a solvent after applying the developing solution to remove the uncured portion of the photoresist.

30. The method of claim 25, wherein the developing solution is selected to comprise a solution of about 2.8% TMAH.

31. The method of claim 24, wherein the immersion liquid is selected to comprise deionized water.

32. The method of claim 24, further comprising forming the elevated containment structure from a photocurable liquid polymer.

33. The method of claim 32, further comprising forming the elevated containment structure from a material used to form the photoresist.

34. The method of claim 33, wherein the material used to form the photoresist is selected to comprise a negative acting photoresist material.

35. The method of claim 24, further comprising forming the elevated containment structure using an STL process.

* * * * *